United States Patent
Lai

(10) Patent No.: US 9,437,611 B1
(45) Date of Patent: Sep. 6, 2016

(54) SEMICONDUCTOR DEVICE AND MANUFACTURING METHOD THEREOF

(71) Applicant: MACRONIX INTERNATIONAL CO., LTD., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/629,537

(22) Filed: Feb. 24, 2015

(51) Int. Cl.
| | |
|---|---|
| H01L 29/78 | (2006.01) |
| H01L 27/115 | (2006.01) |
| H01L 21/28 | (2006.01) |
| H01L 21/311 | (2006.01) |
| H01L 21/02 | (2006.01) |
| H01L 29/49 | (2006.01) |
| H01L 29/16 | (2006.01) |
| H01L 29/04 | (2006.01) |

(52) U.S. Cl.
CPC ..... *H01L 27/11582* (2013.01); *H01L 21/0217* (2013.01); *H01L 21/02164* (2013.01); *H01L 21/02532* (2013.01); *H01L 21/02595* (2013.01); *H01L 21/28282* (2013.01); *H01L 21/31144* (2013.01); *H01L 29/04* (2013.01); *H01L 29/16* (2013.01); *H01L 29/4916* (2013.01)

(58) Field of Classification Search
None
See application file for complete search history.

(56) References Cited

U.S. PATENT DOCUMENTS

| | | | | |
|---|---|---|---|---|
| 9,130,054 | B2* | 9/2015 | Jang | ............... H01L 29/792 |
| 9,305,937 | B1* | 4/2016 | Tsutsumi | .......... H01L 27/11582 |
| 2013/0270631 | A1* | 10/2013 | Kim | .................... H01L 29/7827 257/331 |
| 2014/0141583 | A1 | 5/2014 | Hung et al. | |
| 2016/0148946 | A1* | 5/2016 | Hironaga | .......... H01L 27/11556 257/324 |
| 2016/0181264 | A1* | 6/2016 | Miyamoto | ........ H01L 27/11524 257/314 |

FOREIGN PATENT DOCUMENTS

TW  201517242 A  5/2015

OTHER PUBLICATIONS

TW Office Action dated Apr. 13, 2016 in Taiwan application (No. 104118236).

* cited by examiner

*Primary Examiner* — Ali Naraghi
(74) *Attorney, Agent, or Firm* — McClure, Qualey & Rodack, LLP

(57) ABSTRACT

A semiconductor device and a manufacturing method of a semiconductor device thereof are provided. The manufacturing method includes the following steps. A bottom insulating layer is formed on a substrate. Two stacked structures are formed on the bottom insulating layer. Each of the stacked structures includes a plurality of gate layers, a plurality of gate insulating layers, a top insulating layer and a conductive mask layer. Each of the charge trapping structures includes a plurality of first dielectric layers and a plurality of second dielectric layers. Part of each of first dielectric layers is etched. Part of each of second dielectric layers is etched to expose part of the channel layer. A landing pad layer is formed on the conductive mask layer, the first dielectric layers and the second dielectric layers to connect the conductive mask layer and the channel layer.

11 Claims, 7 Drawing Sheets ns a semiconductor device and manufacturing method thereof

BACKGROUND

1. Technical Field

The disclosure relates in general to a semiconductor device and a manufacturing method thereof, and more particularly to a vertical channel semiconductor device and a manufacturing method thereof.

2. Description of the Related Art

In recent years, the structures of semiconductor devices have been changed constantly, and the storage capacity of the devices has been increased continuously. Memory is used for storing varied electronic products such as MP3 files, digital images, computer documents, etc. As the application increases, the demand for the memory focuses on small size and large memory capacity. For satisfying the requirement, a memory having a high element density and a small size and the manufacturing method thereof are in need.

As such, it is desirable to develop a vertical channel memory to achieve greater storage capacity, a small size, and yet having excellent property and stability.

SUMMARY

The disclosure is directed to a semiconductor device and a manufacturing method thereof. Part of a charge trapping structure is etched and then a landing pad layer is formed to form a thick landing pad for stably connecting with a bit line.

According to a first aspect of the present disclosure, a manufacturing method of a semiconductor device is provided. The manufacturing method includes the following steps. A bottom insulating layer is formed on a substrate. Two stacked structures are formed on the bottom insulating layer. Each of the stacked structures includes a plurality of gate layers, a plurality of gate insulating layers, a top insulating layer and a conductive mask layer. The gate layers and the gate insulating layers are alternately disposed on the bottom insulating layer. The top insulating layer is disposed on the gate layers and the gate insulating layers. The conductive mask layer is disposed on the top insulating layer. A charge trapping structure and a channel layer are formed on a lateral surface of each of the stacked structures and a top surface of the bottom insulating layer. Each of the charge trapping structures includes a plurality of first dielectric layers and a plurality of second dielectric layers. Part of each of first dielectric layers is etched to expose part of each of the second dielectric layers. Part of each of second dielectric layers is etched to expose part of the channel layer. A landing pad layer is formed on the conductive mask layer, the first dielectric layers and the second dielectric layers to connect the conductive mask layer and the channel layer.

According to a second aspect of the present disclosure, a semiconductor device is provided. The semiconductor includes a substrate, a bottom insulating layer, two stacked structures, a charge trapping structure and a landing pad layer. The bottom insulating layer is disposed on the substrate. The stacked structures are disposed on the bottom insulating layer. Each of the stacked structures includes a plurality of gate layers, a plurality of gate insulating layers and a conductive mask layer. The gate layers and the gate insulating layers are alternately disposed on the bottom insulating layer. The top insulating layer is disposed on the gate layers and the gate insulating layers. The conductive mask layer is disposed on the top insulating layer. The charge trapping structure and a channel layer are disposed on a lateral surface of each of the stacked structures and a top surface of the bottom insulating layer. Each of the charge trapping structures includes a plurality of first dielectric layers and a plurality of second dielectric layers. A top of the channel layer is higher than a top of each of the first dielectric layers and a top of each of the second dielectric layers. The landing pad layer is disposed on the conductive mask layer, the first dielectric layers and the second dielectric layers for connecting the conductive mask layer and the channel layer.

The above and other aspects of the disclosure will become better understood with regard to the following detailed description of the non-limiting embodiment(s). The following description is made with reference to the accompanying drawings.

DETAILED DESCRIPTION

Preferred embodiments are disclosed below for elaborating the invention. Part of a charge trapping structure is etched and then a landing pad layer is formed to form a thick landing pad for stably connecting with a bit line. The following embodiments are for the purpose of elaboration only, not for limiting the scope of protection of the invention. Besides, secondary elements are omitted in the following embodiments to highlight the technical features of the invention.

Figure 1:
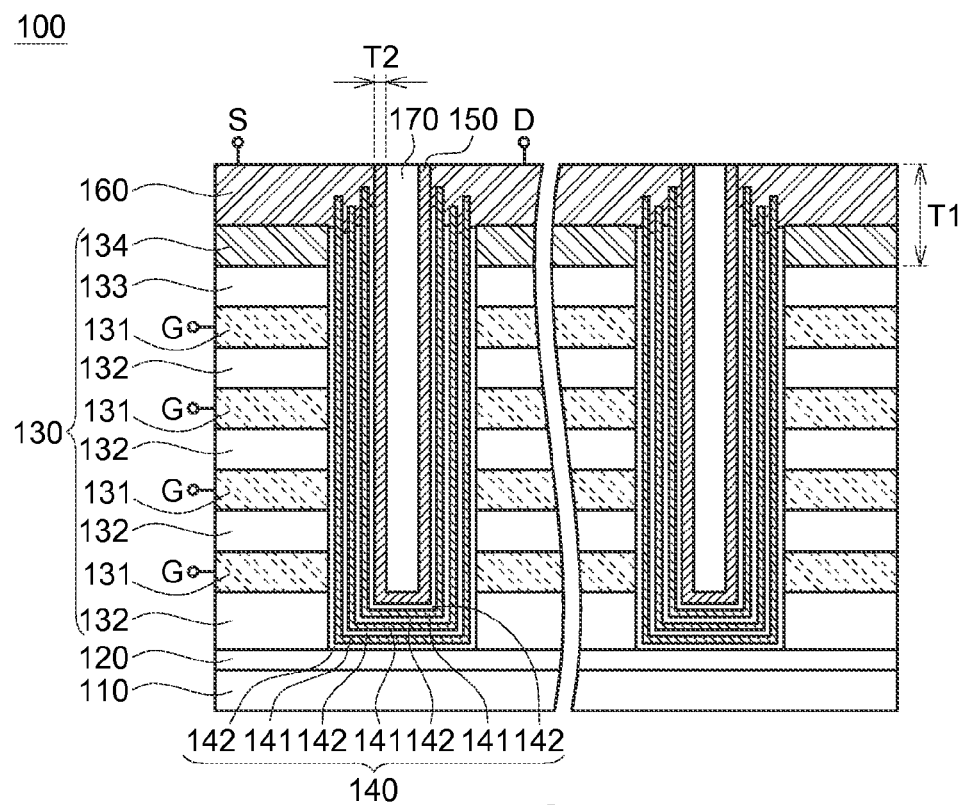
FIG. 1 shows a semiconductor device.

Please referring FIG. 1, a semiconductor device 100 is shown. For example, the semiconductor device 100 is a three-dimensional vertical channel NAND device. The semiconductor device 100 includes a substrate 110, a bottom insulating layer 120, at least two stacked structures 130, a charge trapping structure 140, a channel layer 150, a landing pad layer 160 and a spaced insulating layer 170.

Each stacked structure 130 includes a plurality of gate layers 131, a plurality of gate insulating layers 132, a top insulating layer 133 and a conductive mask layer 134. The charge trapping structure 140 includes a plurality of first dielectric layer 141 and a plurality of second dielectric layer 142. Each gate layer 131 is connected to a gate G, the landing pad layer 160 is connected to a source S or a drain D.

The landing pad layer 160 is connected to a bit line. As shown in FIG. 1, because a thickness T1 of a combination of the conductive mask layer 134 and the landing pad layer 160 is larger than a thickness T2 of the channel layer 150, a contact resistance between the bit line and the landing pad layer 160 can be reduced. Furthermore, it is easy to make a contact between the bit line and the landing pad layer 160. It is a self-aligned process without any additional lithography process. Moreover, the connect between the channel layer 150 and the landing pad layer 160 is at the side-wall of the channel layer 150, not at the top of the channel layer 150. It will improve the process window and reduce the resistance. In addition, no corner edge effect will be happened in this structure. The reason is that there is no first dielectric layer 141 (SiN) at any corner edge which will be easily programmed/erased due to the electric field enhancement.

Figure 2A:
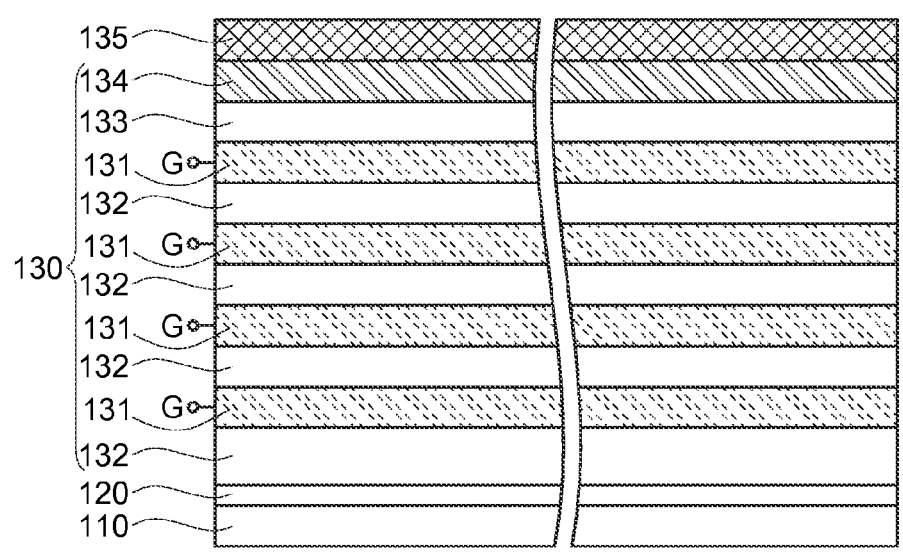
FIGS. 2A to 2F show a flowchart of a manufacturing method of the semiconductor device according to one embodiment.

Please referring to FIGS. 2A to 2F, a flowchart of a manufacturing method of the semiconductor device 100 according to one embodiment is shown. As shown in FIG. 2A, the substrate 110 is provided. Then, as shown in FIG. 2A, the bottom insulating layer 120 is formed on the substrate 110. For example, a material of the bottom insulating layer 120 is silicon oxide.

Next, as shown in FIG. 2A, the gate layers 131 and the gate insulating layer 132 are alternately formed on the bottom insulating layer 120, such that the gate layers 131 are electrically insulated with each other. For example, a material of each gate layer 131 may be N+ or P+ doping polysilicon, preferred P+ doping polysilicon, and a material of each gate insulating layer 132 is silicon oxide.

Then, as shown in FIG. 2A, the top insulating layer 133 is formed on the gate layers 131 and the gate insulating layers 132. For example, a material of the top insulating layer 133 is silicon oxide.

Next, as shown in FIG. 2A, the conductive mask layer 134 is formed on the top insulating layer 133 for preventing etching the top insulating layer 133 and connecting to the landing pad layer 160 (shown in FIG. 1) and the channel layer 150 (shown in FIG. 1).

Then, as shown in FIG. 2A, the insulating mask layer 135 is formed on the conductive mask layer 134. For example, a material of the insulating mask layer 135 is silicon nitride.

Figure 2B:
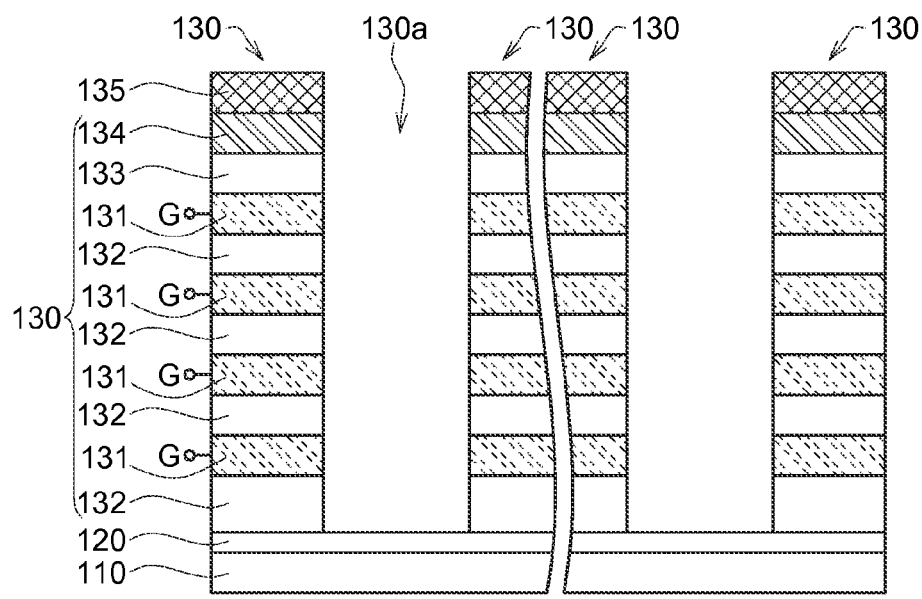

Next, as shown in FIG. 2B, the gate layers 131, the gate insulating layers 132, the top insulating layer 133, the conductive mask layer 134 and the insulating mask layer 135 are etched to form two stacked structures 130 and a trench 130a located therebetween. The insulating mask layer 135 is used for stabilizing the stacked structures 130 during the manufacturing process.

Figure 2C:
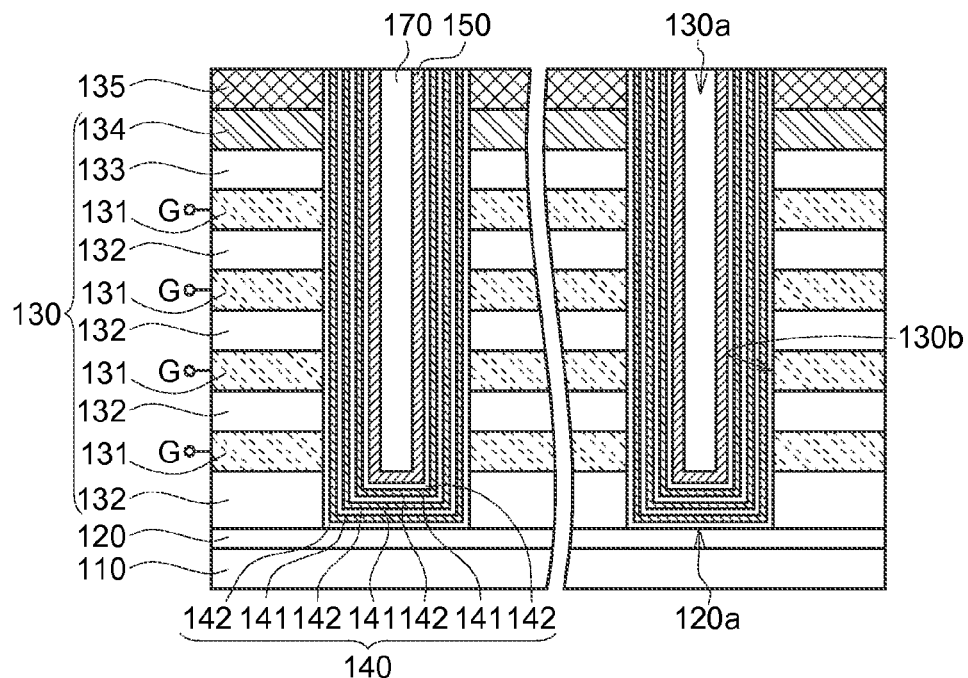

Then, as shown in FIG. 2C, the charge trapping structure 140 and the channel layer 150 are formed on a lateral surface 130b of each stacked structure 130 and a top surface 120a of the bottom insulating layer 120. The charge trapping structure 140 and the channel layer 150 are U shaped. A material of the channel layer 150 may be an intrinsic or undoped polysilicon. For example, the charge trapping structure 140 may be an O1N1O2N2O3N3O4 structure (O1 is closer to the channel layer 150 and O4 is closer to the stacked layer 130). The 4 different silicon oxide layer (O1, O2, O3 and O4) have different thicknesses and the 3 different silicon nitride layer (N1, N2, N3) have different thicknesses. Or, the charge trapping structure 140 may be an O1N1O2N2O3 (O1 is closer to the channel layer 150 and O3 is closer to the stacked layer 130). The 3 different silicon oxide layer (O1, O2, O3) have different thicknesses and the 2 different silicon nitride layer (N1, N2) have different thicknesses. The different thicknesses are based on the purpose of tunneling (O1N1O2), trapping (N2), blocking (O3 or O3N3O4).

Next, as shown in FIG. 2C, the spaced insulating layer 170 is filled in the trench 130a formed between the stacked structures 130. For example, a material of the spaced insulating layer 170 is silicon oxide. In this step, the spaced insulating layer 170 may not be fully filled in the trench 130a, and an air gap structure may be formed in the spaced insulating layer 170. Air can be a good insulator.

Figure 2D:
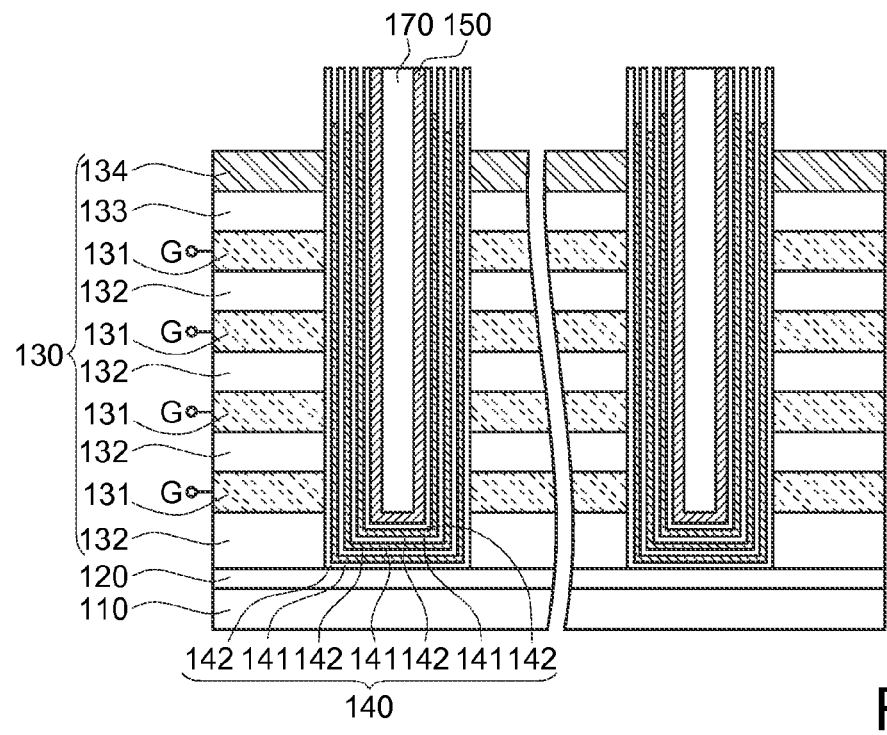

Afterwards, as shown in FIG. 2D, part of each first dielectric layer 141 is etched to expose part of each second dielectric layer 142. In this step, $H_3PO_4$ is used for etching silicon nitride. Because $H_3PO_4$ has high selectivity to polysilicon and silicon oxide, the conductive mask layer 134, the channel layer 150, the second dielectric layers 142 and the spaced insulating layer 170 will not be etched. In this step, the insulating mask layer 135 is removed, so the surface of the conductive mask layer 134 is exposed. Part of the first dielectric layer 141 is etched, so two lateral walls of at least one of the second dielectric layers 142 are partially exposed.

Because thicknesses of the first dielectric layers 141 are different, the first dielectric layers 141 will be etched with different depths under the etching loading effect.

Figure 2E:
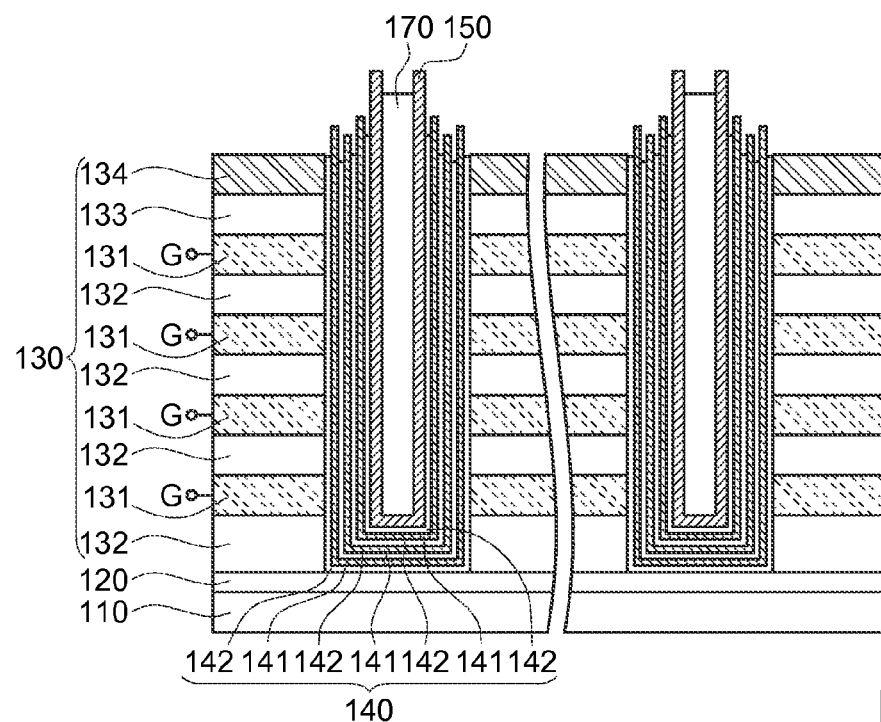

Next, as shown in FIG. 2E, part of each second dielectric layer 142 is etched to expose part of the channel layer 150. In this step, DHF is used for etching silicon oxide. Because DHF has high selectivity to polysilicon and silicon nitride, the conductive mask layer 134, the channel layer 150 and the first dielectric layers 141 will not be etched.

In this step, part of each second dielectric layer 142 is etched, so two lateral walls of each first dielectric layer 141 are exposed. Furthermore, part of the spaced insulating layer 170 is also etched, so two lateral walls of the channel layer 150 are partially exposed, and a top of the channel layer 150 is higher than tops of the first dielectric layers 141 and tops of the second dielectric layer 142.

Because thicknesses of the second dielectric layers 142 are different, the second dielectric layers 142 will be etched with different depths under the etching loading effect. Moreover, the conductive mask layer 134 can prevent the top insulating layer 133 from damage.

Figure 2F:
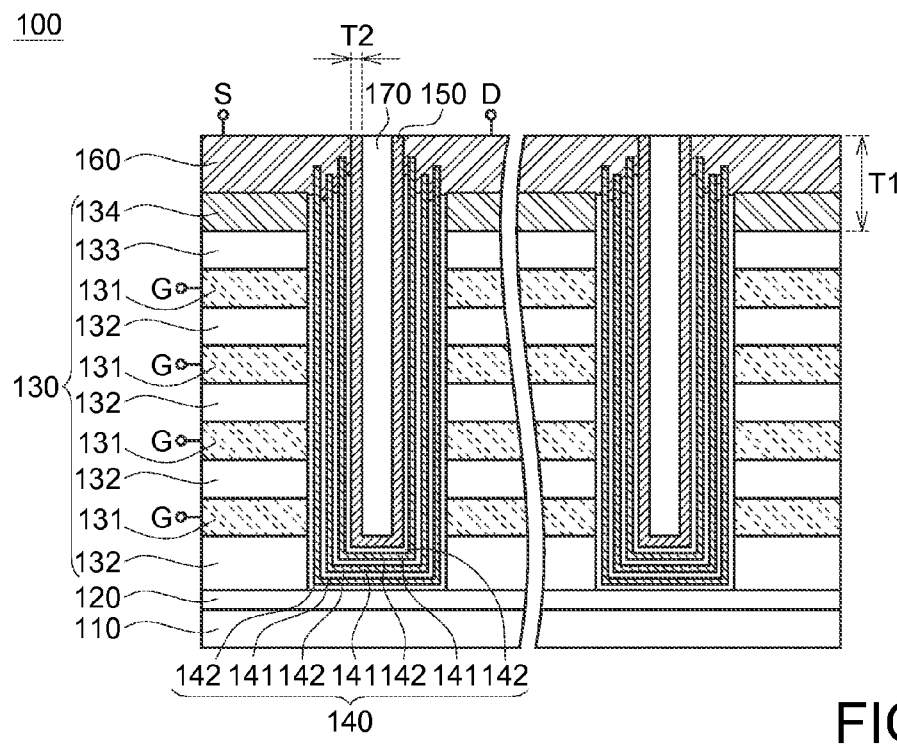

Next, as shown in FIG. 2F, the landing pad layer 160 is formed on the conductive mask layer 134, the first dielectric layers 141 and the second dielectric layers 142 to connect the conductive mask layer 134 and the channel layer 150. For example, a material of the landing pad layer 160 is N type doping polysilicon.

In this step, the landing pad layer 160 and the channel layer 150 are also polished, such that top surfaces of the landing pad layer 160, the channel layer 150 and spaced insulating layer 170 are located at the same level. The combination of the conductive mask layer 134 and the landing pad layer 160 is used as a landing pad for connecting the bit line. The thickness T1 of the combination of the conductive mask layer 134 and the landing pad layer 160 is larger than the thickness T2 of the channel layer 150, such that the contact resistance between the bit line and the landing pad layer 160 can be reduced. Moreover, the connect between the channel layer 150 and the landing pad layer 160 is at the side-wall of the channel layer 150, not at the top of the channel layer 150. It will improve the process window and reduce the resistance. Furthermore, it is easy to make a contact between the bit line and the landing pad layer 160. In addition, no corner edge effect will be happened in this structure. The reason is that no first dielectric layer 141 (SiN) at corner edge which will be easily programmed/erased due to the electric field enhancement.

In the manufacturing method described above, the insulating mask layer 135 is used for stabilizing the stacked structures 130 during the manufacturing process. In one embodiment, the manufacturing method can be performed without forming the insulating mask layer 135. Please referring to FIGS. 3A to 3F, a flowchart of a manufacturing method of a semiconductor device 200 according to another embodiment is shown. In this embodiment, a thickness of a conductive mask layer 234 is increased, such that the conductive mask layer 234 can be used for stabilizing the stacked structure 230.

Figure 3A:
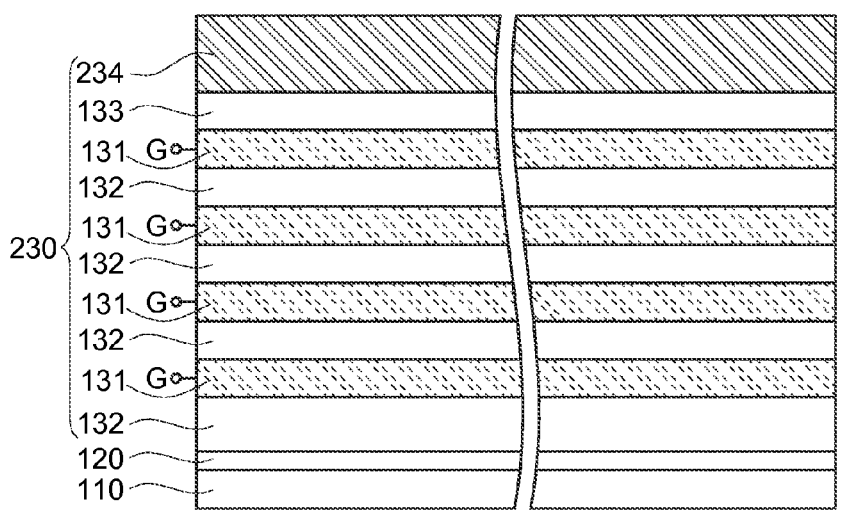
FIGS. 3A to 3F show a flowchart of a manufacturing method of the semiconductor device according to another embodiment.
Figure 3B:
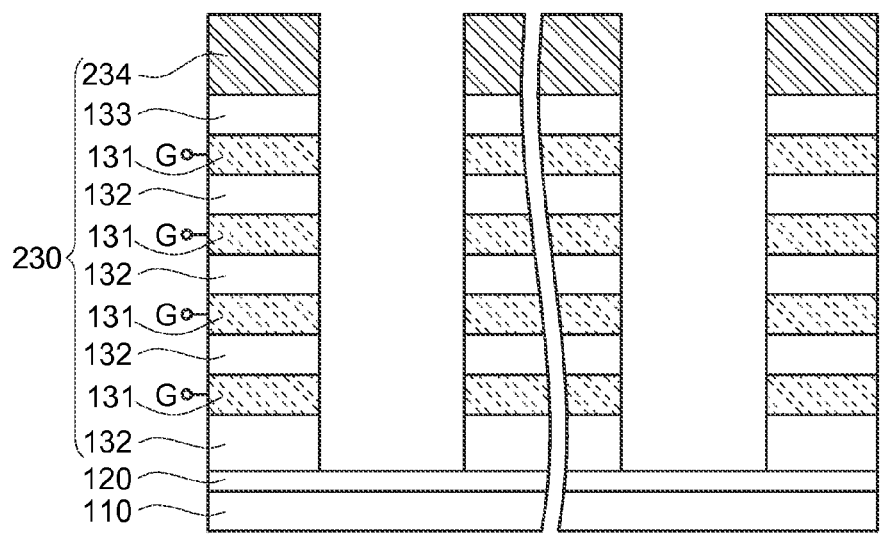
Figure 3C:
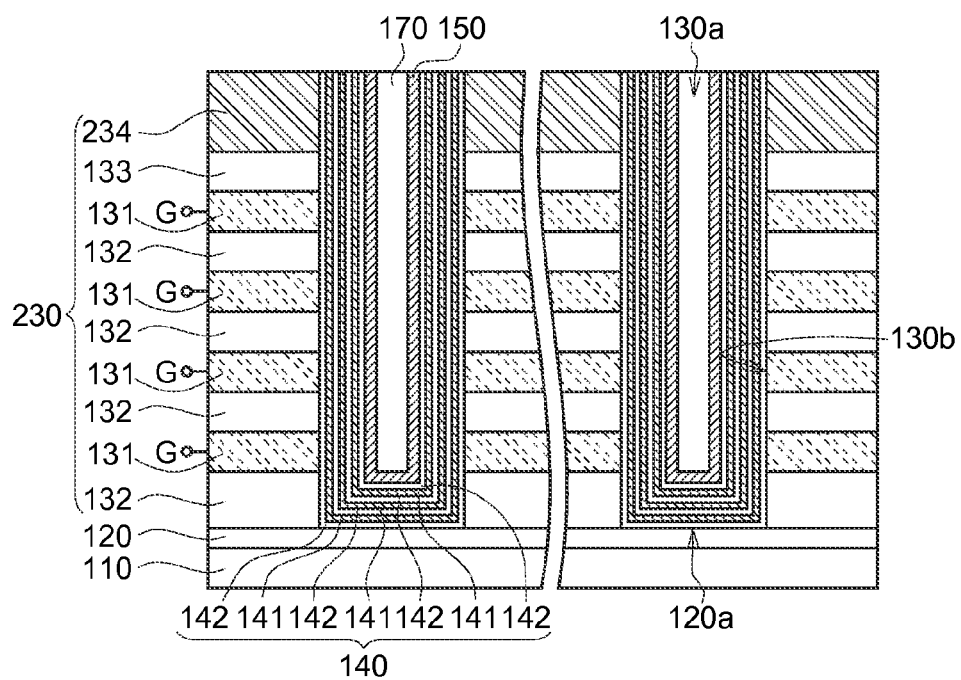
Figure 3D:
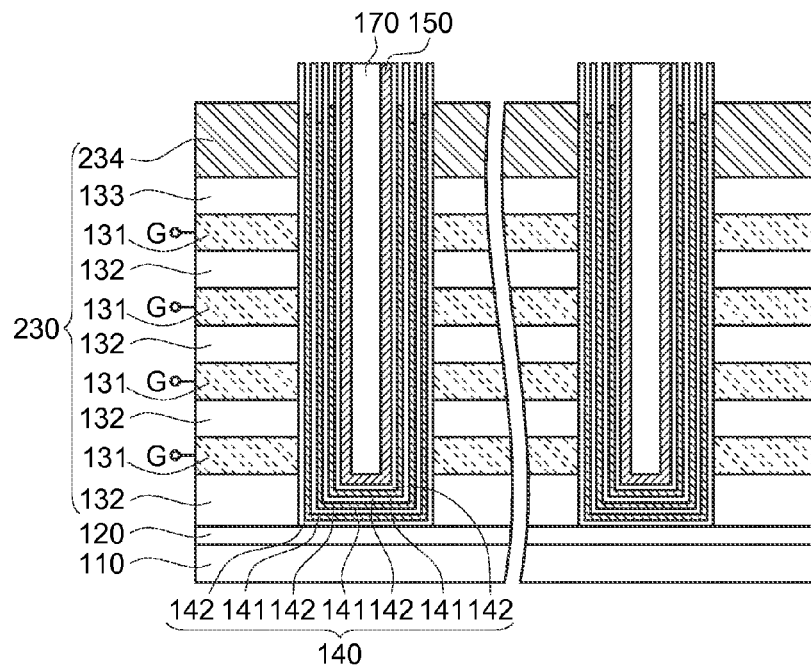
Figure 3E:
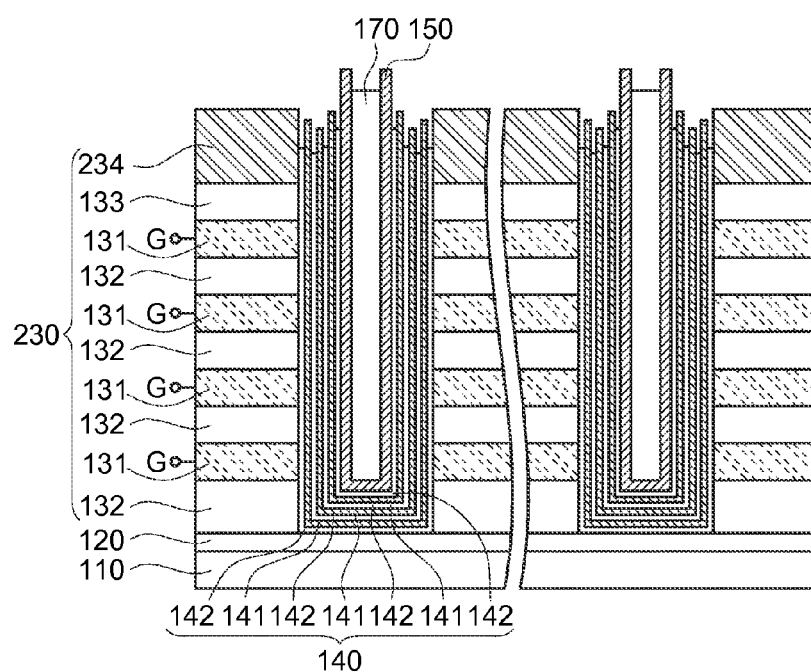
Figure 3F:
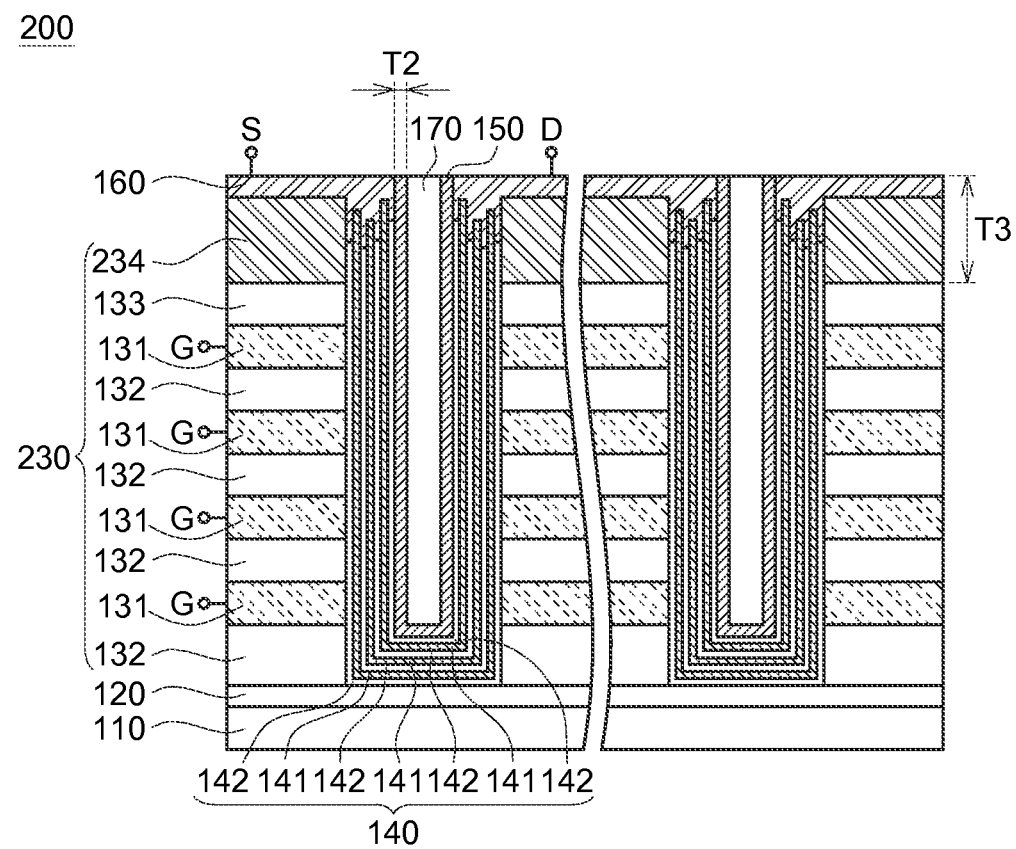

In FIG. 3F, the landing pad layer 160 and the conductive mask layer 234 are used as a landing pad for connecting the bit line. A thickness T3 of the conductive mask layer 234 and the landing pad layer 160 is larger than the thickness T2 of the channel layer 150, such that the contact resistance between the bit line and the landing pad layer 160 can be reduced. Furthermore, it is easy to make a contact between the bit line and the landing pad layer 160.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor device, comprising:

forming a bottom insulating layer on a substrate;

forming two stacked structures on the bottom insulating layer, wherein each of the stacked structures includes a plurality of gate layers, a plurality of gate insulating layers, a top insulating layer and a conductive mask layer, the gate layers and the gate insulating layers are alternately disposed on the bottom insulating layer, the top insulating layer is disposed on the gate layers and the gate insulating layers, and the conductive mask layer is disposed on the top insulating layer;

forming a charge trapping structure and a channel layer on a lateral surface of each of the stacked structures and a top surface of the bottom insulating layer, wherein each of the charge trapping structures includes a plurality of first dielectric layers and a plurality of second dielectric layers;

etching part of each of first dielectric layers to expose part of each of the second dielectric layers;

etching part of each of second dielectric layers to expose part of the channel layer; and forming a landing pad layer on the conductive mask layer, the first dielectric layers and the second dielectric layers to connect the conductive mask layer and the channel layer.

2. The manufacturing method of the semiconductor device according to claim 1, wherein each of the stacked structures further includes an insulating mask layer disposed on the conductive mask layer, in the step of etching part of each first dielectric layer, the insulating mask layer is removed.

3. The manufacturing method of the semiconductor device according to claim 2, wherein a material of each of the first dielectric layers and a material of the insulating mask layer are the same.

4. The manufacturing method of the semiconductor device according to claim 1, wherein a material of the conductive mask layer, a material of the channel layer and a material of the landing pad layer are the same.

5. The manufacturing method of the semiconductor device according to claim 1, wherein in the step of etching part of each of the first dielectric layers, the first dielectric layers are etched with different depths.

6. The manufacturing method of the semiconductor device according to claim 1, wherein in the step of etching part of each of the first dielectric layers, two lateral walls of at least one of the second dielectric layers are partially exposed.

7. The manufacturing method of the semiconductor device according to claim 1, wherein in the step of etching part of each of the second dielectric layers, the second dielectric layers are etched with different depths.

8. The manufacturing method of the semiconductor device according to claim 1, further comprising:

filling a spaced insulating layer in a trench formed between the stacked structures;

wherein in the step of etching part of each of the second dielectric layers, part of the spaced insulating layer is also etched, such that a top of the channel layer is higher than tops of the first dielectric layers and tops of the second dielectric layer.

9. The manufacturing method of the semiconductor device according to claim 1, wherein the step of etching part of each of the second dielectric layers is performed after the step of etching part of each of the first dielectric layers.

10. The manufacturing method of the semiconductor device according to claim 1, wherein a material of each of the first dielectric layers is silicon nitride, and a material of each of the second dielectric layers is silicon oxide.

11. The manufacturing method of the semiconductor device according to claim 1, wherein a material of each of the gate layers is P type doping polysilicon, and a material of each of the conductive mask layer, the channel layer and the landing pad layer is N type doping polysilicon.

* * * * *